United States Patent
Sato

(10) Patent No.: US 6,493,511 B2
(45) Date of Patent: Dec. 10, 2002

(54) FPC (FLEXIBLE PRINTED CIRCUIT) BOARD ARRANGEMENT STRUCTURE FOR ZOOM LENS BARRELS

(75) Inventor: Norio Sato, Tokyo (JP)

(73) Assignee: Pentax Corporation, Tokyo (JP)

( * ) Notice: Subject to any disclaimer, the term of this patent is extended or adjusted under 35 U.S.C. 154(b) by 0 days.

(21) Appl. No.: 09/941,764

(22) Filed: Aug. 30, 2001

(65) Prior Publication Data
US 2002/0025148 A1 Feb. 28, 2002

(30) Foreign Application Priority Data
Aug. 31, 2000 (JP) ........................................ 2000-264109

(51) Int. Cl.$^7$ .............................................. G03B 17/00
(52) U.S. Cl. .......................... 396/72; 396/462; 396/542
(58) Field of Search .......................... 396/542, 72, 451, 396/462

(56) References Cited

U.S. PATENT DOCUMENTS

| | | | |
|---|---|---|---|
| 5,051,764 A | * 9/1991 | Nomura | 396/462 |
| 5,398,163 A | 3/1995 | Sano | 361/749 |
| 5,655,171 A | * 8/1997 | Machida et al. | 396/542 X |
| 5,717,969 A | * 2/1998 | Miyamaoto et al. | 396/542 X |
| 5,758,208 A | * 5/1998 | Fujii et al. | 396/542 X |
| 5,809,361 A | 9/1998 | Nomura et al. | 396/542 |
| 5,884,105 A | * 3/1999 | Nomura et al. | 396/72 |
| 5,917,158 A | 6/1999 | Takao et al. | 396/542 X |
| 5,950,019 A | * 9/1999 | Azegami et al. | 396/72 |
| 6,052,535 A | * 4/2000 | Uno | 396/72 |
| 6,112,034 A | 8/2000 | Takao et al. | 396/542 |

* cited by examiner

Primary Examiner—W. B. Perkey
(74) Attorney, Agent, or Firm—Greenblum & Bernstein P.L.C.

(57) ABSTRACT

An FPC (flexible printed circuit) board arrangement structure for zoom lens barrels of a camera is provided. The FPC board connects a shutter block carried by each zoom lens and a controller carried by the camera. The FPC board has a first portion to be connected to the shutter block, a second portion to be connected to the controller, and a connecting portion connecting the first and second portions. The connecting portion includes at least one foldable portion and a deformable portion. The length of the deformable portion is substantially constant regardless of an extended amount of a zoom lens barrel. The foldable portion is folded when the flexible printed circuit board is implemented in one of the zoom lens barrels, and is unfolded when implemented in another zoom lens barrel.

17 Claims, 13 Drawing Sheets

FPC (FLEXIBLE PRINTED CIRCUIT) BOARD ARRANGEMENT STRUCTURE FOR ZOOM LENS BARRELS

BACKGROUND OF THE INVENTION

The present invention relates to a structure of arranging an FPC (flexible printed circuit) board in zoom lens barrels whose extending amounts are different.

Generally, a camera having an extendible/retractable zoom lens barrel is provided with an FPC (flexible printed circuit) board, which connects a controller in a camera body and a shutter block provided in the zoom lens. The FPC board is arranged to extend along an inner surface of the zoom lens barrel. Since there are various types of zoom lenses having different specifications, it has been difficult to use the same FPC board for different types of zoom lenses. For example, if extendible amounts of shutter blocks of two zoom lenses are different, the lengths of the FPC board should be adjusted to follow the extendible amounts, respectively. If the FPC board for a lens having a longer extendible length is used in a lens whose extendible amount is smaller, the FPC board may slack inside the zoom lens. In order to avoid the problem, it may be possible to provide an urging mechanism to apply tension to the FPC board to cancel the slack. However, such an additional mechanism requires a room therefor, and further, may raise a manufacturing cost.

SUMMARY OF THE INVENTION

It is therefore an object of the invention to provide an improved structure of arranging an FPC board in a zoom lens, with which a common FPC board can be used for various types of zoom lenses having different extendible amounts.

For the above object, according to the invention, there is provided an FPC (flexible printed circuit) board arrangement structure zoom lens barrels of a camera, the zoom lens barrels having different extendible/retractable ranges. The FPC board connects a shutter block carried by each zoom lens and a controller carried by the camera. The FPC board is configured to have a first portion to be connected to the shutter block, a second portion to be connected to the controller, and a connecting portion connecting the first portion and the second portion. The connecting portion includes at least one foldable portion and a deformable portion. The deformable portion is deformed to change its shape in accordance with a movement of the zoom lens barrel. The at least one foldable portion is folded at least when the flexible printed circuit board is implemented in one of the zoom lens barrels. It should be noted that the at least one foldable portion is unfolded when the FPC board is implemented in another zoom lens barrel.

With this structure, the same FPC board can be used for various types of zoom lenses having different extendible amounts. That is, by only folding the foldable portion depending on the extendible range of the zoom lens in which the FPC board is implemented, the length of the FPC board can easily be adjusted.

When the at least one foldable portion is folded, a first portion side area of the connecting portion may be folded. In this case, the at least one foldable portion is located, when folded, in front of the shutter block. In a particular case, the at least one foldable portion as folded may include at least one linearly extending area which extends in a direction substantially perpendicular to the optical axis.

Optionally, the at least one linearly extending area may include a plurality of linearly extending areas overlaid along the optical axis direction.

Further optionally, the at least one foldable portion may have a second foldable portion which is located at a second portion side area of the connecting portion. In an example, the second foldable portion may be folded when the flexible printed circuit board is implemented in the another zoom lens barrel. In a particular case, the second foldable portion as folded may be smoothly connected from the deformable portion to form a linearly extending portion which is substantially an extension of the deformable portion and a folded back portion overlaid on the linearly extending portion. In this case, an end of the linearly extending portion may be bent toward the controller.

In the above structure, the deformable portion may include a first area, which extends in an optical axis direction, between the shutter block and the second extendible portion, a U-shaped portion bent to form a U-shaped curved portion, and a first area, which extends in an optical axis direction, between the stationary barrel and the first extendible portion. In a particular case, a length of the deformable portion may be substantially constant regardless of an extended amount of the zoom lens barrel, the location of the U-shaped portion being changed so that a relative proportion of lengths of the first area and the second area is changed in accordance with an extended amount of the zoom lens barrel.

According to another aspect of the invention, there is provided an FPC board arrangement structure for zoom lens barrels of a camera, the zoom lens barrels having different extendible/retractable ranges. The FPC board connects a shutter block carried by each zoom lens and a controller carried by the camera. In one example, the FPC board has a first portion to be connected to the shutter block, a second portion to be connected to the controller, and a connecting portion connecting the first portion and the second portion. The connecting portion includes a plurality of foldable portions and a deformable portion. The deformable portion is a portion deformed to change its shape in accordance with the extended position of a zoom lens barrel in which the flexible printed circuit board is implemented. The plurality of foldable portions can be selectively folded in accordance with the extendible/retractable amount of the zoom lens barrel in which the flexible printed circuit board is implemented.

Optionally, the connecting portion is an elongated rectangular portion when the flexible printed circuit board is unfolded.

According to another aspect of the invention, there is provided another flexible printed circuit board arrangement structure for zoom lens barrels of a camera. The zoom lens barrels have different extendible/retractable ranges, and the flexible printed circuit board connects a shutter block carried by each zoom lens and a controller carried by the camera. The FPC board connects a shutter block carried by each zoom lens and a controller carried by the camera. The FPC board is configured to have a first portion to be connected to the shutter block, a second portion to be connected to the controller, and a connecting portion connecting the first portion and the second portion. The connecting portion includes at least one foldable portion and a deformable portion. The deformable portion is deformed to change its shape in accordance with the extended position of a zoom lens barrel in which the flexible printed circuit board is implemented. The connecting portion has at least one folded portion at least when the flexible printed circuit board is implemented in a zoom lens having a shorter extendible/retractable range, the at least one folded portion being unfolded when the flexible printed circuit board is implemented in a zoom lens having a longer extendible/retractable range.

BRIEF DESCRIPTION OF THE ACCOMPANYING DRAWINGS

DETAIL DESCRIPTION OF THE EMBODIMENT

Hereinafter, an embodiment of the invention will be described with reference to the accompanying drawings. It should be noted that, in the following description, two types of zoom lens barrels having different zooming ranges (i.e., maximum extendible amounts) will be described. For the sake of simplicity, it is assumed that the two lens barrels have substantially the same structure except for some parts, which have, for example, different sizes in a direction of an optical axis of the zoom lens.

Figure 4:
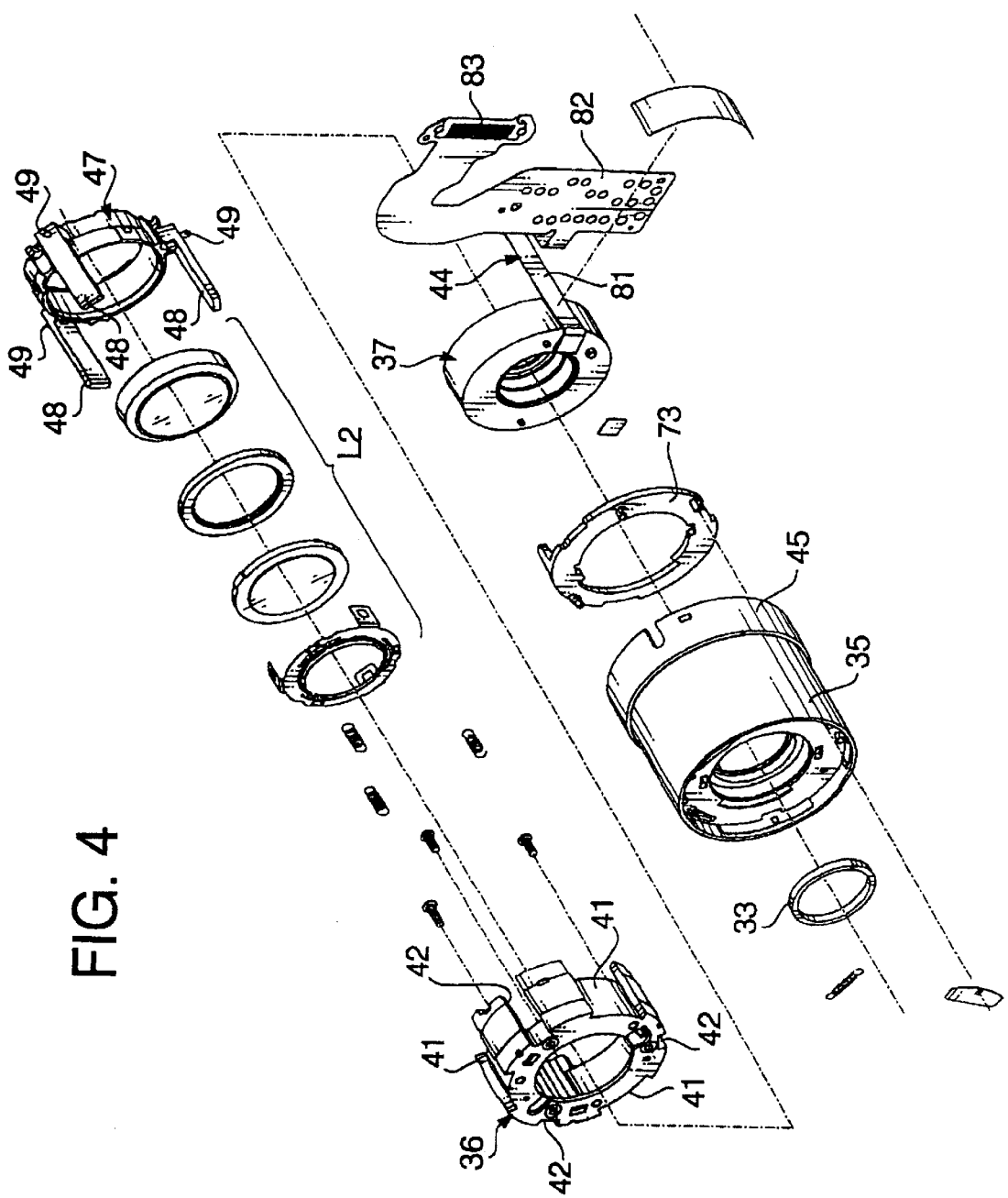
FIG. 4 is a partially enlarged exploded perspective view of the zoom lens shown in FIG. 1.
Figure 5:
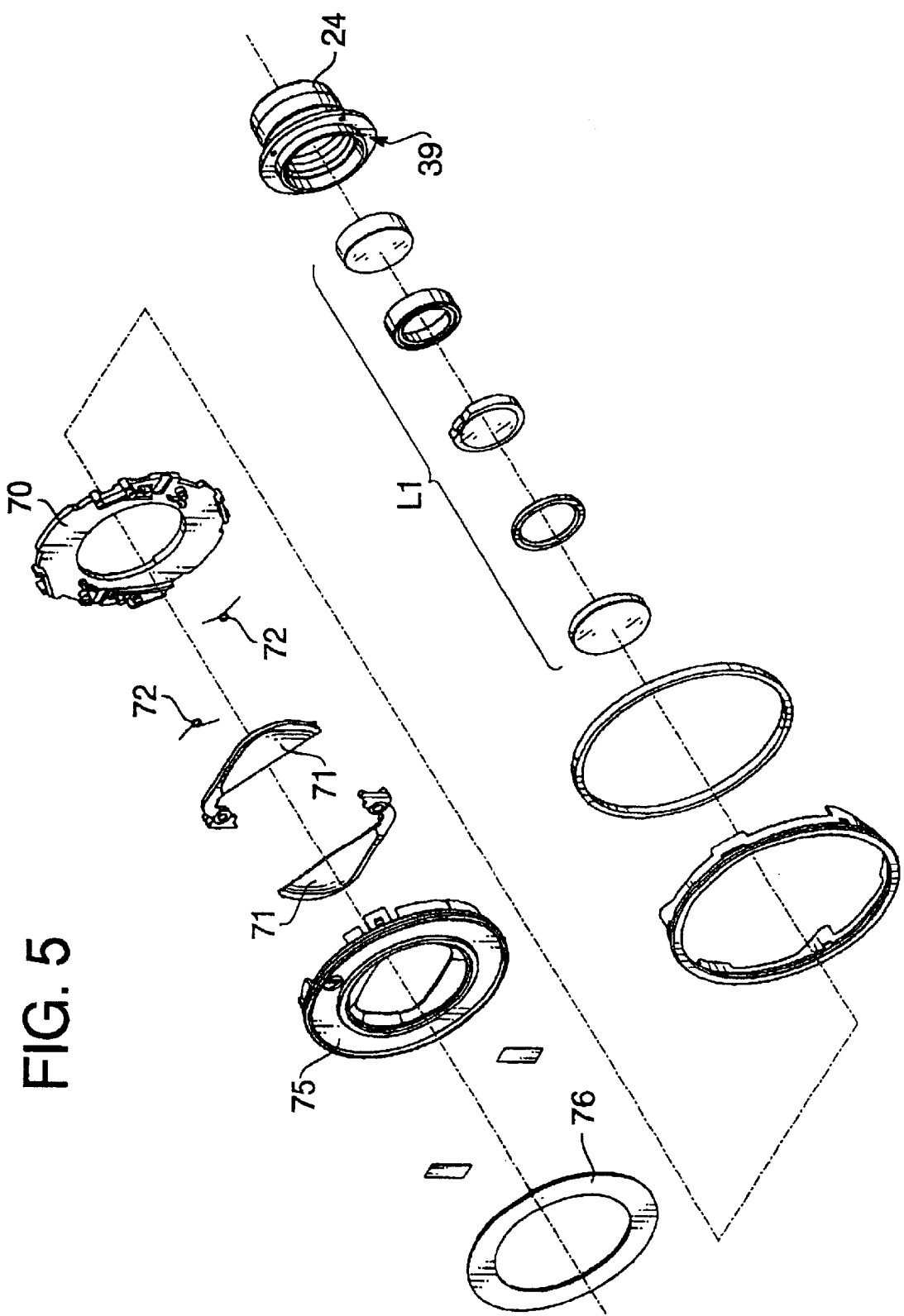
FIG. 5 is a partially enlarged exploded perspective view of the zoom lens shown in FIG. 1.
Figure 6:
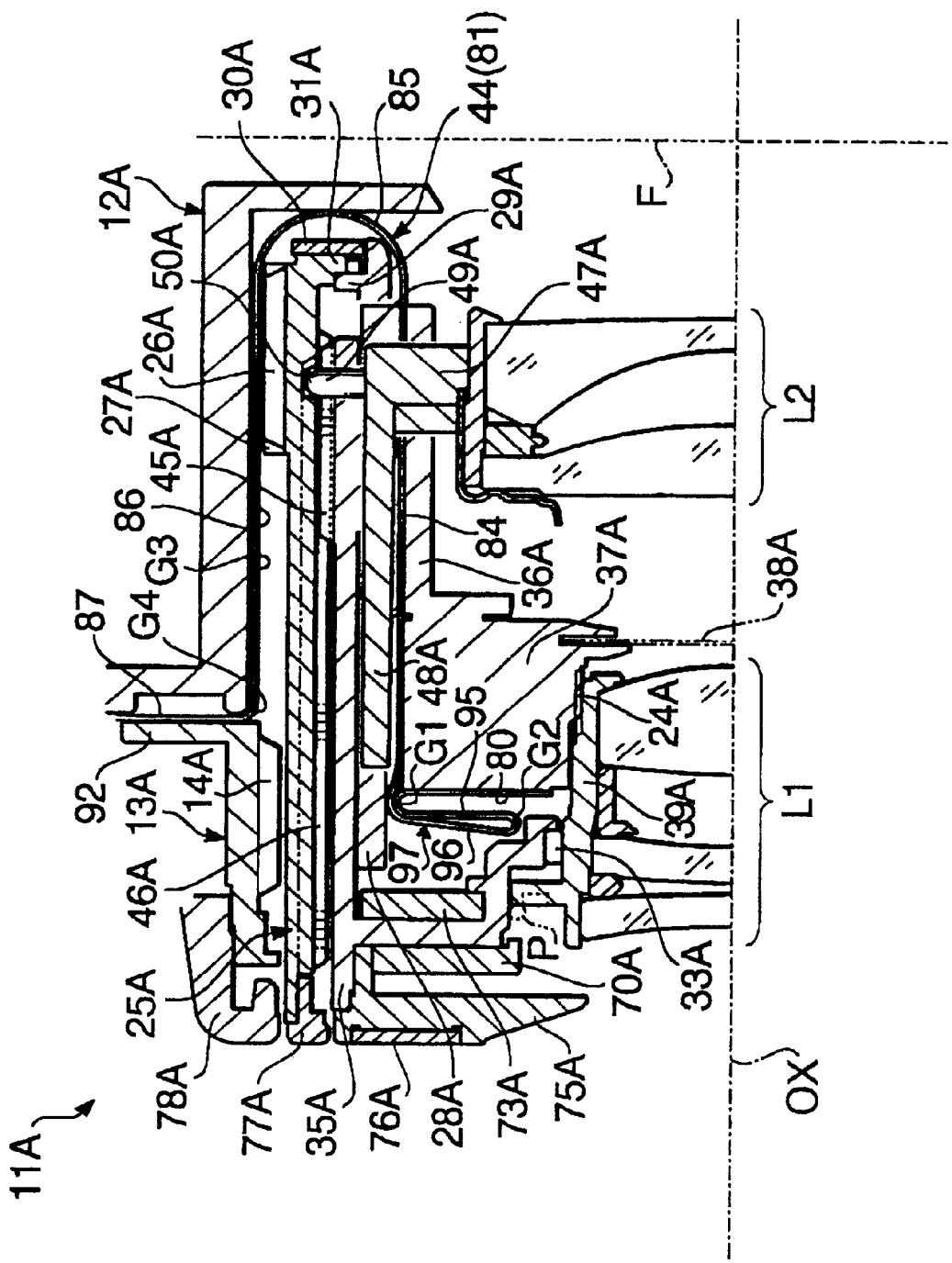
FIG. 6 shows a cross-sectional view of an upper half of a zoom lens whose extendible amount is relatively small when the lens is fully retracted.
Figure 7:
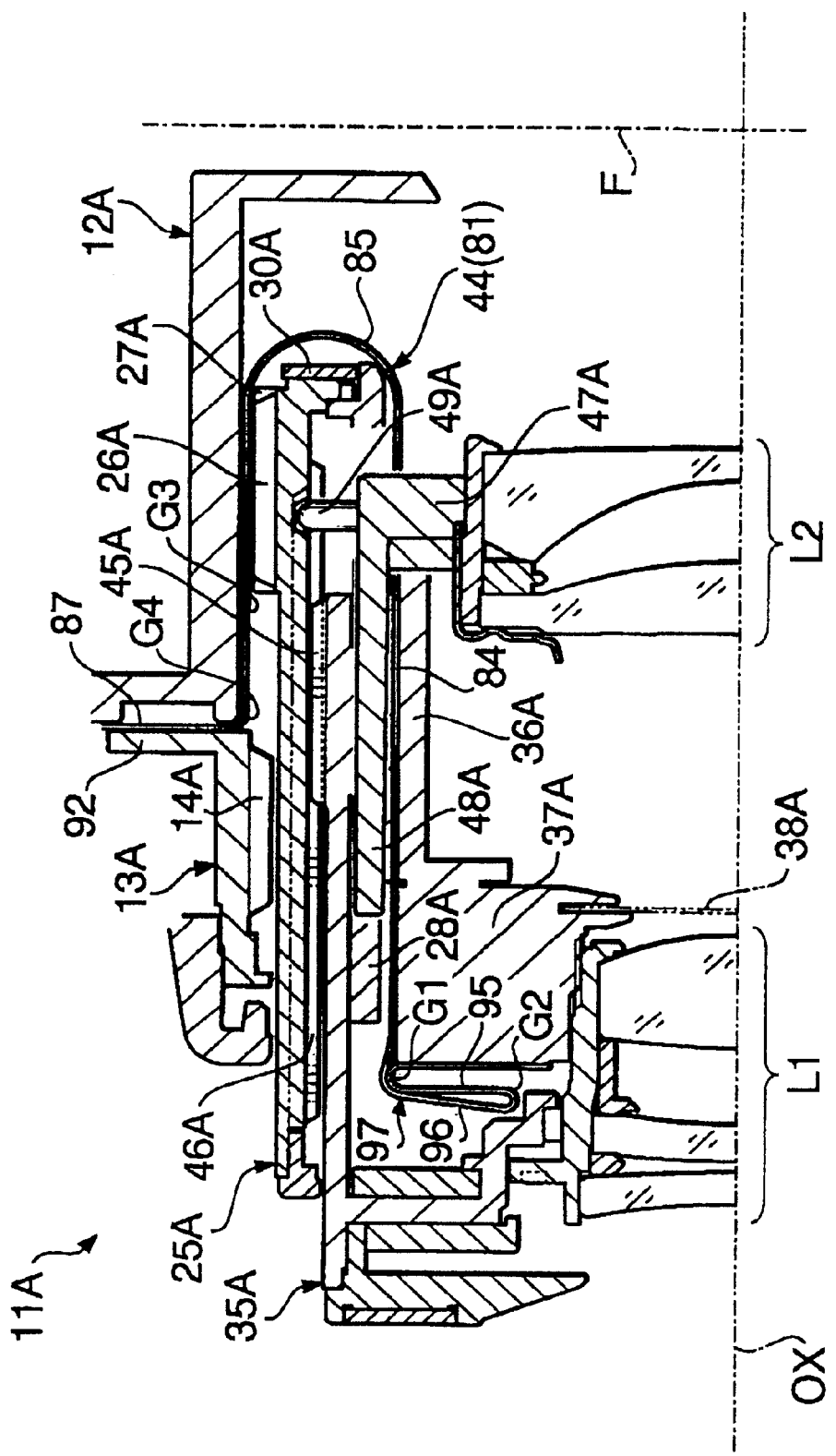
FIG. 7 shows a cross-sectional view of an upper half of the zoom lens shown in FIG. 6 when it is located at a wide extremity.
Figure 8:
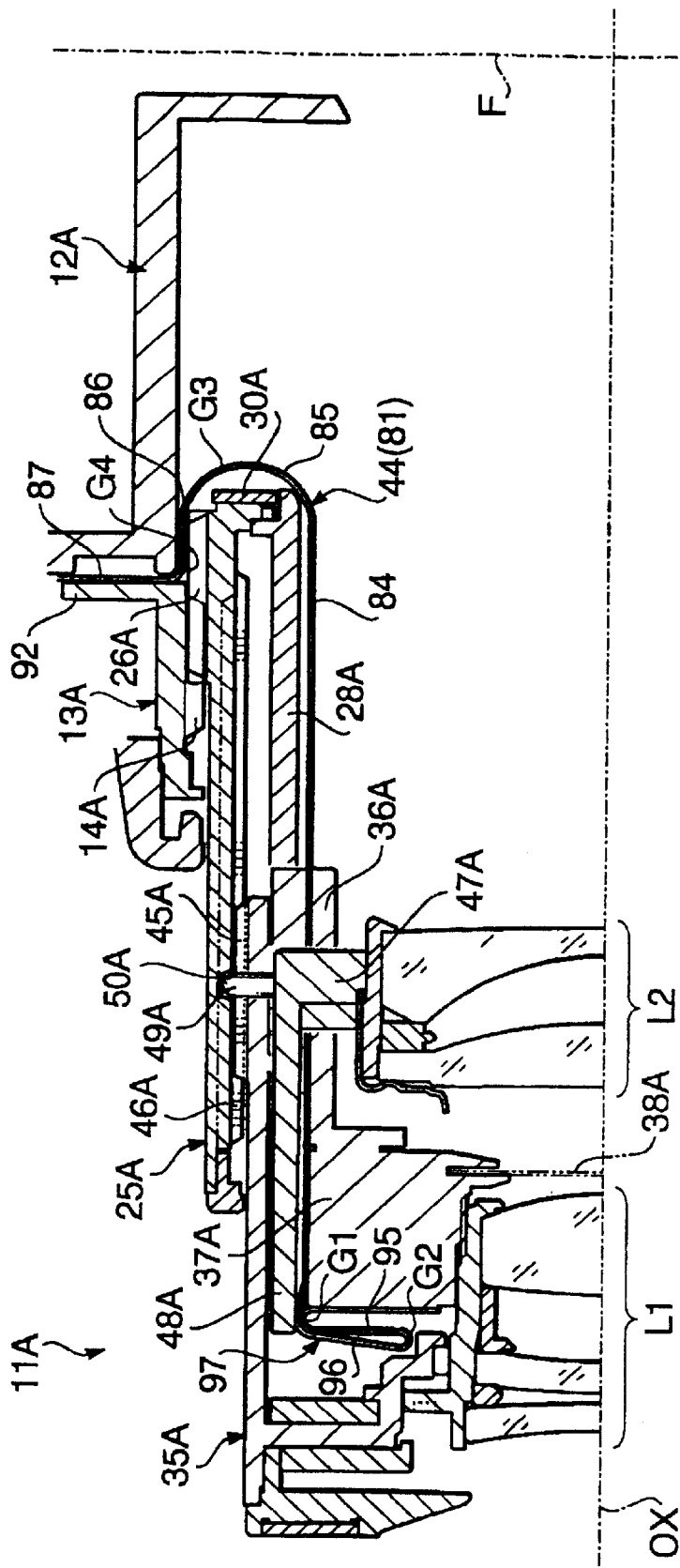
FIG. 8 shows a cross-sectional view of an upper half of the zoom lens shown in FIG. 6 when it is located at a telephoto extremity.
Figure 9:
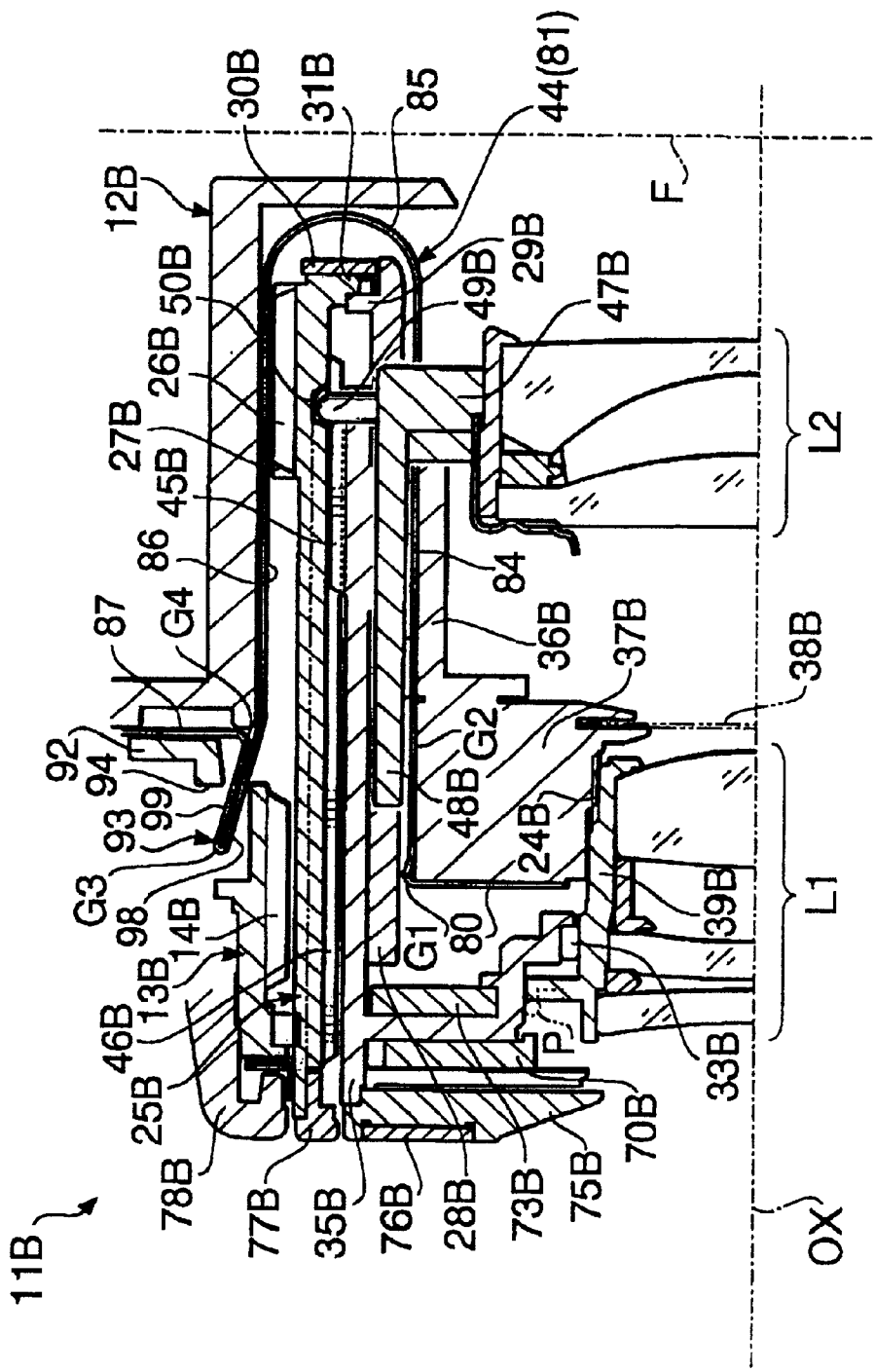
FIG. 9 shows a cross-sectional view of an upper half of a zoom lens whose extendible amount is relatively large when the lens is fully retracted.
Figure 10:
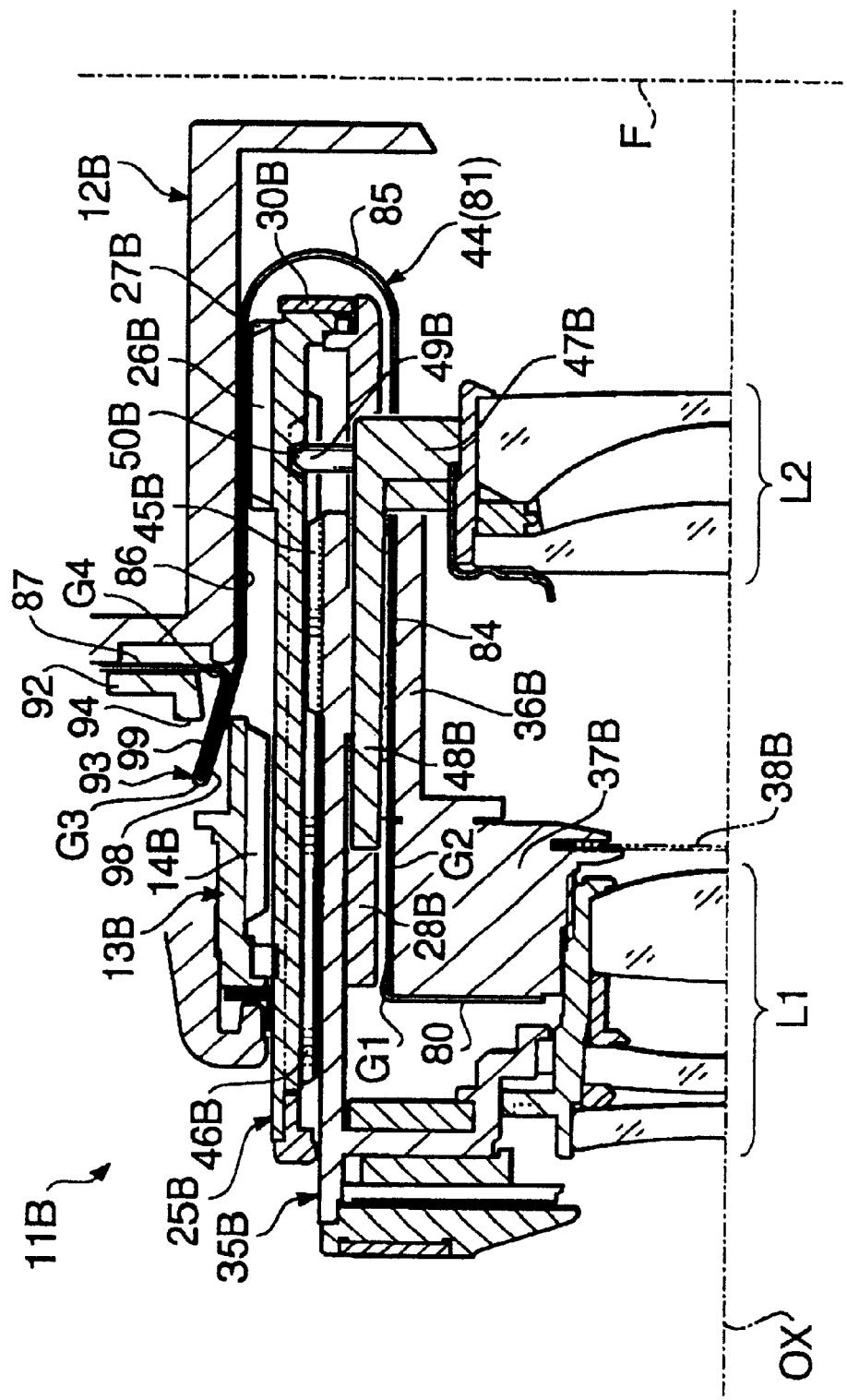
FIG. 10 shows a cross-sectional view of an upper half of the zoom lens shown in FIG. 9 when it is located at a wide extremity.
Figure 11:
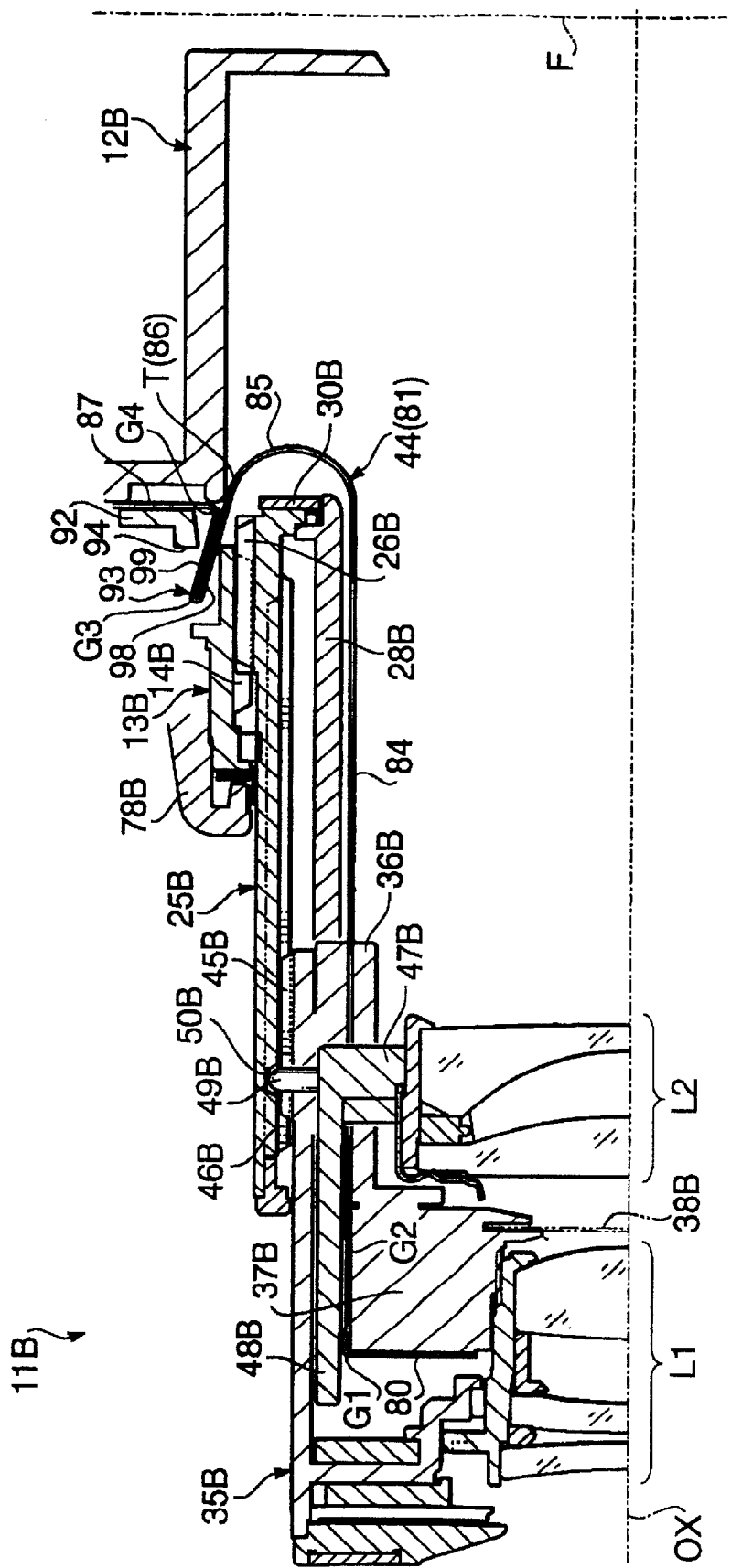
FIG. 11 shows a cross-sectional view of an upper half of the zoom lens shown in FIG. 9 when it is located at a telephoto extremity.

FIGS. 6–8 show cross-sectional views of a zoom lens barrel 11A whose zooming range is relatively small, while FIGS. 9–11 show cross-sectional views of a zoom lens barrel 11B whose zooming range is relatively large. In these drawings, the same reference numerals are assigned to the corresponding elements, and a letter A is affixed to the numerals for components of the zoom lens barrel 11A having a smaller zooming range, and a letter B is affixed to the numerals for components of the zoom lens barrel 11B having a larger zooming range. Further, in the following description, the numerals which are not affixed by letter A or B denote components commonly used in the zoom lens barrels 11A and 11B. FIGS. 1–5 show exploded perspective views the zoom lens barrel 11A. The schematic structure of the zoom lens barrel 11B is substantially similar to that of the zoom lens barrel 11A. Therefore, in these drawings (FIGS. 1–5), the letters A and B are not affixed to the numerals. It should be noted, however, in FIGS. 1 and 3, a reference numeral 13A is assigned to a stationary barrel since the appearance of the same is different from a stationary barrel 13B of the zoom lens 11B.

In the description hereinafter, a direction of an optical axis or parallel to an optical axis is defined as a direction in an optical axis OX of a photographing lens (i.e., the zoom lens 11A or 11B) when the photographing lens is coupled to a camera body.

Structure of Zoom Lens Barrels

An overall structure of a zoom lens barrel (i.e., the zoom lens barrel 11A or 11B) will be described.

Figure 1:
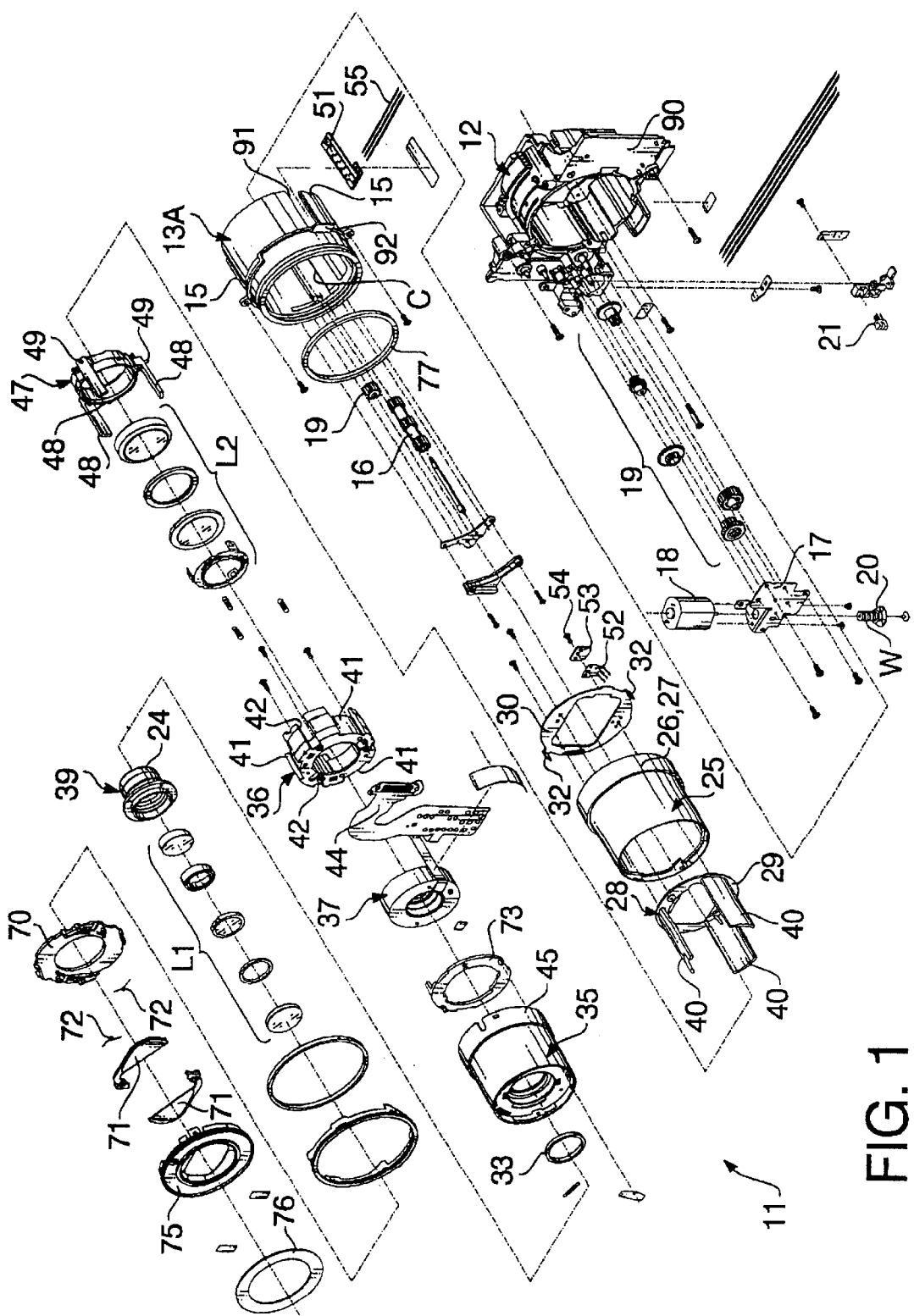
FIG. 1 is an exploded perspective view of a zoom lens to which a structure according to an embodiment of the invention is applied.
Figure 2:
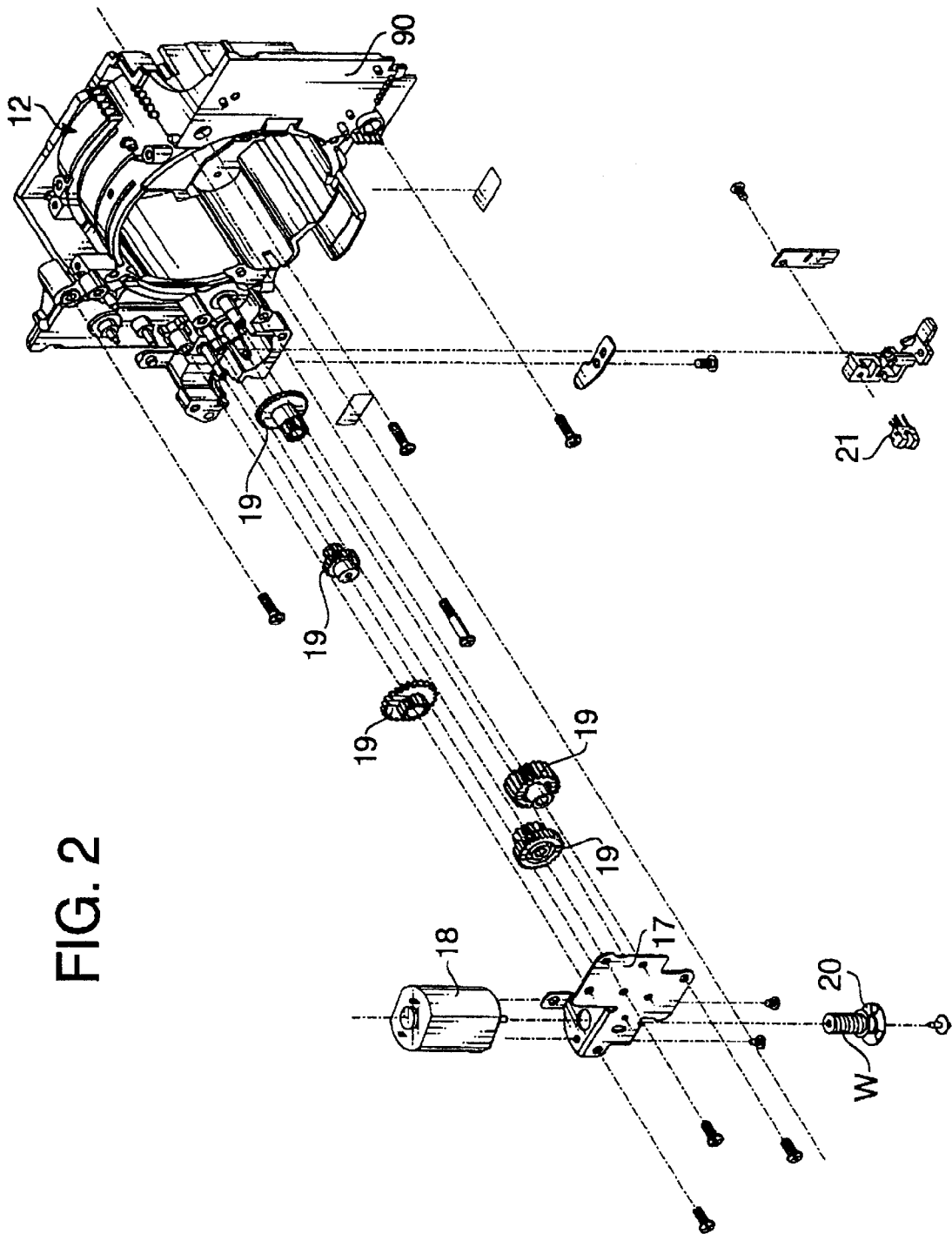
FIG. 2 is a partially enlarged exploded perspective view of the zoom lens shown in FIG. 1.

As shown in FIGS. 1 and 2, the zoom lens 11 has a housing 12, which is securely fixed to a body (not shown) of a camera. Inside the housing 12, a stationary barrel 13 is fixed. On an inner surface of the stationary barrel 13, female helicoids 14 are formed. Across an area where the female helicoids 14 are formed, a cut out portion C and a pair of guide grooves 15 extending in the optical axis direction is formed on the stationary barrel 13. To the cut-out portion C of the stationary barrel 13, a multi-gear pinion 16 is provided. Specifically, the multi-gear pinion 16 is supported such that it is rotatable about an axis parallel to the optical axis OX, and teeth of the gear portions are protruded inside the stationary barrel 13. In the housing 12, a zoom motor 18 is secured via a motor supporting plate 17. A rotational force of the zoom motor 18 is transmitted to the multi-gear pinion 16 through a worm gear W and a zoom gear train 19.

As clearly shown in FIG. 2, to a spindle shaft of the zoom motor 18, a disk member 20 formed with a plurality of slits is fixed. Using a photo interrupter 21, by detecting the slits formed on the disk member 20, a rotational amount of the zoom motor 18 can be detected. Thus, the disk member 20 and the photo interrupter 21 serve as a pulse encoder.

As will be described, extending/retracting amount of the zoom lens barrel 11 (11A or 11B) corresponds to the rotation amount of the zoom motor 18. Therefore, using an encoder including the disk member 20 and the photo interrupter 21, a moving amount of the zoom lens barrel 11 is monitored and controlled.

Figure 3:
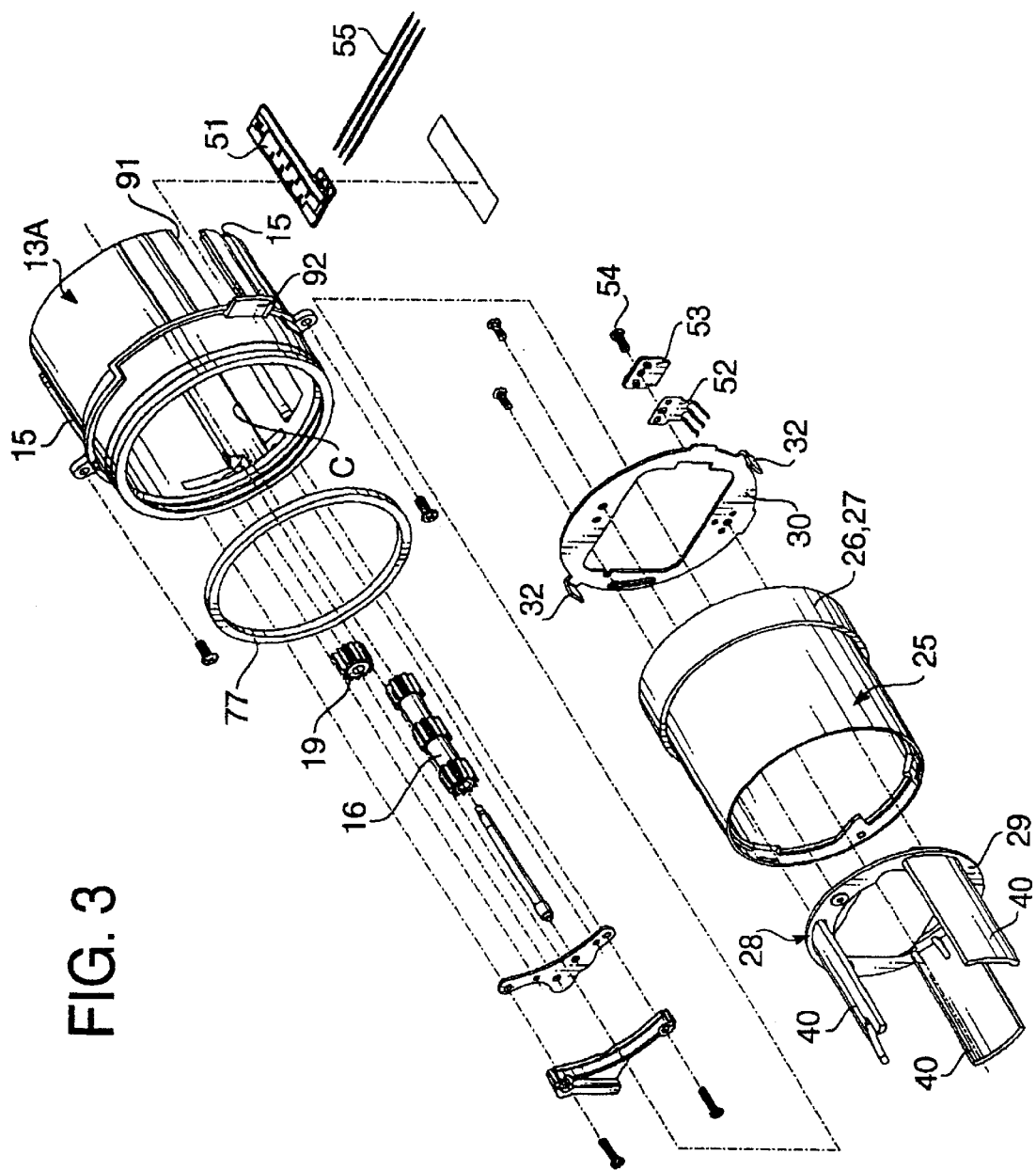
FIG. 3 is a partially enlarged exploded perspective view of the zoom lens shown in FIG. 1.

In FIGS. 1 and 3, reference numeral 25 denotes a cam ring. On an outer circumference of the cam ring 25, at a camera body side end portions, male helicoids 26 are formed, which engage with the female helicoids 14 formed on the stationary barrel 13. The length of an area where the male helicoids 26 are formed, in the optical axis direction, is determined such that they are not exposed to outside when the cam ring 25 is fully extended. On the same circumference where the male helicoids 26 are formed, and within an area parallel to the area where the male helicoids 26 are formed, a plurality of outer gear portions 27 are formed. The teeth of each of the outer gear portions 27 are formed in a direction parallel to the optical axis OX, and the gear portions of the multi-gear pinion 16 engage with the outer gear portions 27, respectively.

Inside the cam ring 25, a linear guide ring (a linear moving barrel) 28 is provided. At the camera body side end of the linear guide ring 28, a flange 29 extending outwardly is formed. Further, on the camera body side surface of the linear guide ring 28, a linear guide plate 30 is fixed. By the outer flange 29 and the linear guide plate 30, an inner flange 31 formed at a camera body side end of the cam ring 25 is sandwiched. With this structure, the liner guide ring 28 is coupled to the cam ring 25 such that the linear guide ring 28 is not movable in the optical axis direction but rotatable, about the optical axis OX, with respect to the cam ring 25.

The linear guide plate 30 is provided with a pair of guide protrusions 32, at opposite positions along its circumference, which extend outwardly in the radial direction. Each of the guide protrusions 32 slidably engages with guide grooves 15. With this structure, the linear guide ring 28 and the linear guide plate 30 are movable, in the optical axis direction, integrally with the cam ring 25, while rotation of the linear guide ring 28 and the linear guide plate 30 about the optical axis OX with respect to the stationary barrel 13 is prevented.

The cam ring 25 and the linear guide ring 28 serve as a first extending unit of the zoom lens barrel 11. When the zoom motor 18 is driven and the multi-gear pinion 16 is rotated in a predetermined direction for extending the lens, the cam ring 25 is rotated via the outer gear portions 27, and due to engagement of the male helicoids 26 and the female helicoids 14, the cam ring 25 is extended, as rotated, from the stationary barrel 13. Since the linear guide ring 28 is rotatable to the cam ring 25, the linear guide ring 28 moves in the direction of the optical axis together with the cam ring 25 with respect to the stationary barrel 13, as linearly guided.

As shown in FIGS. 6–11, a lens supporting barrel 35 is provided between the cam ring 25 and the linear guide ring 28. Inside the lens supporting barrel 35, a shutter mounting ring 36 is secured. On a front end portion of the shutter mounting ring 36, the shutter block 37 is secured. The shutter block 37 has a built-in shutter drive motor 34 (see FIG. 13), which is driven to open/close shutter blades 38. The shutter drive motor 34 is connected to a CPU (a shutter control unit) 60 (see FIG. 13) via an FPC board 44. Specifically, in response to shutter open/close signals transmitted from the CPU 60 via the FPC board 44, the shutter drive motor 34 opens/closes the shutter blades 38. The FPC board 44 has a particular shape, which will be described later, so as to be used in both of the zoom lens barrels 11A and 11B.

The shutter block 37 supports, via a first lens frame 39, a first lens group L1 (see FIGS. 1 and 5). On an outer surface of the first lens frame 39 and an inner surface of the shutter block 37, adjusting screws 24, which engage with each other, are formed. Using the adjusting screws 24, the position, in the optical axis direction, of the first lens frame 39 with respect to the shutter block 37 or the lens supporting barrel 35 can be adjusted. Between the first lens frame 39 and the lens supporting barrel 35, a friction member 33 is provided so that a rattle therebetween is not caused. When the above-described adjustment of the first lens frame 39 has been finished, the first lens frame 39 is secured to the lens supporting barrel 35 using, for example, adhesive P (see FIG. 6 or 9). As described above, when the lens barrel has been assembled, the first lens group L1 is fixedly mounted on the lens supporting barrel 35, and is moved along the optical axis OX integrally with the lens supporting barrel 35.

The liner guide ring 28 has a shape such that a circumferential surface of a cylinder is divided into three linear guide arms 40 as shown in FIG. 1 or FIG. 3. On the shutter mounting ring 36 fixed to the lens supporting barrel 35, three first linear guide grooves 41 and three second linear guide grooves 42 are formed, alternately in the circumferential direction as shown in FIG. 4. To the first linear guide grooves 41, the three linear guide arms 40 are slidably fitted, respectively. With the engagement between the linear guide arms 40 and the linear guide grooves 41, the shutter mounting ring 36, the lens supporting barrel 35 and the shutter block 37 are linearly guided in the direction of the optical axis OX.

On the outer circumference of the lens supporting barrel 35, at the camera body side end portion, male helicoids 45 are formed. The male helicoids 45 engage with female helicoids 46 formed on the inner surface of the cam ring 25. When the cam ring 25 rotates, due to the engagement of the male helicoids 45 with the female helicoids 46, the lens supporting barrel 35, which is linearly guided by the linear guide ring 28, is moved in the direction of the optical axis OX with respect to the cam ring 25, or the first extendible portion. That is, the lens supporting barrel 35 constitutes a second extendible portion of the zoom lens barrel 11. Since the first lens group L1 is fixed to the lens supporting barrel 35, the first lens group L1 moves in the optical axis direction integrally with the lens supporting barrel 35.

It should be noted that, according to the embodiment, a moving amount, along the optical axis OX, of the second extendible portion with respect to the housing is substantially twice of that of the first extendible portion.

To the linear guide grooves 42 of the shutter mounting ring 36, three linear guide arms 48 are slidably fitted, respectively. The three linear guide arms 48 are provided to a second lens frame 47, which supports a second lens group L2. With the slidable engagement of the linear guide arms 48 with the linear guide grooves 42, the second lens frame 47 is linearly guided. From each of linear guide arms 48, a cam roller 49 is outwardly protruded in the radial direction. The cam rollers 49 slidably fitted in second guide cam grooves 50 formed on the inner circumferential surface of the cam ring 25, respectively. Each of the second guide cam grooves 50 inclines by a predetermined amount with respect to the optical axis OX. Thus, when the cam ring 25 rotates, due to engagement of the cam rollers 49 with the cam grooves 50, the second lens frame 47, which is guided in the direction of the optical axis OX, is moved in the direction of the optical axis OX with respect to the lens supporting barrel 35. In other words, when the cam ring 25 rotates, the second lens group L2 moves in the direction of the optical axis OX, in accordance with the shape of the second guide cam grooves 50.

The camera according to the embodiment is configured such that the focal length range of the zoom lens (from the wide extremity to the telephoto extremity) is divided into a predetermined number of focal length steps, and by controlling the rotation of the cam ring 25, the focal length of the lens is changed stepwise. Further, by controlling the rotation of the cam ring 25, a focusing condition can be changed such that any object located between a closest focusable distance and infinity can be focused at each focal length step. That is, only by rotating the cam ring 25, both the focal length and focusing condition at each focal length step can be changed.

According to the embodiment, the movement of the first lens group L1 in the optical axis direction has a linear relationship with respect to the rotation angle (amount) of the cam ring 25. The second lens group L2 is guided by the second lens guiding cam grooves 50 and changes its position with respect to the first lens group L1 so that the focusing condition is changed at each focal length step. The rotation angle of the cam ring 25 is controlled, based on object distance information, so that an in-focus condition is obtained within a current focal length step. The rotation of the cam ring 25 is controlled using a pulse signal in accordance with the output of the photo interrupter 21.

On the inner circumferential surface of the stationary barrel 13, a code plate 51 is secured, and a brush 52 is secured to the linear guide plate 30. As the linear guide plate 30 moves in the optical axis direction, the brush 52 slides on the code plate 51, and thus, based on a code detected by the brush 52, the current position of the lens can be detected. Specifically, the code plate 51 is connected to the CPU 60 via lead lines 55, and when the position where the brush 52 contacts the code plate 51 is changed as the linear guide plate 30 moves in the optical axis direction, the current focal length step can be detected. The brush 52 is secured on the linear guide plate 30 using a brush support plate 53 and a screw 54 (see FIG. 3).

Figure 13:
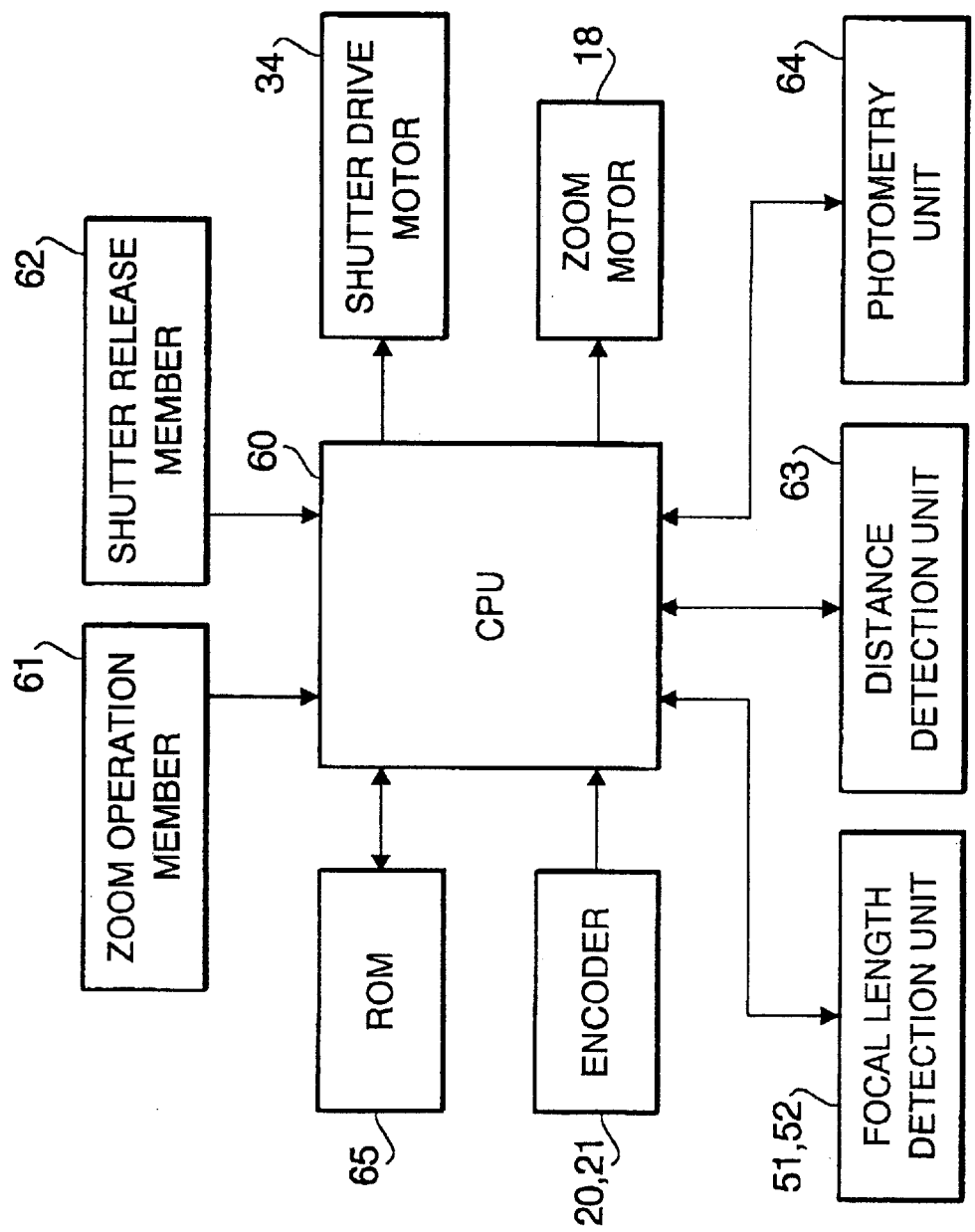
FIG. 13 is a block diagram of a control system of a zoom lens camera to which the structure shown in FIGS. 1–11 is applicable.

FIG. 13 shows a block diagram of a controlling system of the zoom lens camera 10. As shown in FIG. 13, the zoom lens camera 10 has a zoom operating member 61, a shutter release member 62, a distance measuring module 63 and a photometry module 64, each of which is connected to the CPU 60. The zoom operating member 61 is a manually operable member operated to input a command for zooming of the zoom lens barrel 11, i.e., a command for moving the zoom lens between the telephoto extremity and the wide extremity. The shutter release member 62 includes a release button. When the release button is depressed halfway, a command for executing a distance measurement by the distance measuring module 63 and a photometry operation using the photometry module 64 is issued. When the release button is fully depressed, the shutter drive motor 34 is driven, based on the output of the photometry module 64, to open the shutter blades 38 for a predetermined period of time.

The zoom lens camera 10 is further provided with a ROM (or an EEPROM) 65 connected to the CPU 60. In the ROM 65, a formula for calculating the number of rotations of the cam ring 25 in order to bring the zoom lens system in the in-focus position in each focal length step.

At the front end portion of the zoom lens barrel 11, a barrier mechanism is provided. The barrier mechanism closes a space in front of the first lens group when the zoom lens barrel 11 is retracted in the housing 12, and opens when the zoom lens barrel 11 is located in a zooming range. Specifically, the barrier mechanism includes, as shown in FIG. 1 or 5, a pair of barrier plates 71 supported by a barrier supporting member 70, barrier urging springs 72 that urge the pair of barrier plates 71 to close, respectively, a barrier driving ring 73, and the like. The barrier driving ring 73 is configured to rotate as the lens supporting barrel 35 moves in the optical axis direction, and drives the barrier plates 71 to open or close.

In front of the lens mounting barrel 35, a decorative plate 75 covering the barrier mechanism is provided. The front surface of the decorative plate 75 is covered with a decorative ring 76 (see FIG. 5). Another decorative ring 77 is provided on the front surface of the cam ring 25 (see FIG. 1). The front end of the stationary barrel 13 is covered with a front cover of the camera body.

Movement of the Zoom Len Barrels

Movement of the zoom lens will be described hereinafter.

FIG. 6 shows a cross-sectional view of an upper half of a shorter zoom lens 11A when the lens is fully retracted, and FIG. 9 shows a cross-sectional view of an upper half of a longer zoom lens 11B when the lens is fully retracted. FIG. 7 shows a cross-sectional view of an upper half of the zoom lens 11A shown in FIG. 6 when it is located at the wide extremity, and FIG. 10 shows a cross-sectional view of an upper half of the zoom lens 11B shown in FIG. 9 when it is located at the wide extremity.

When the zoom lens 11A or 11B is located at a position as shown in FIG. 6, 7, 9 or 10, and the zoom motor 18 is driven to extend the zoom lens barrel 11A (11B), the cam ring 25 is rotated and extends from the stationary barrel 13. The linear guide ring 28 moves to the front as being guided by the stationary barrel 13. When the cam ring 25 is rotated, the lens supporting barrel 35, which is engaged with the cam ring 25 through the helicoids and is linearly guided, is moved in the optical axis direction together with the first lens group L1. At the same time, the second lens group L2 moves inside the lens supporting barrel 35, as being guided by the cam grooves 50, in a loci different from that of the first lens group L1. Thus, the first lens group L1 and the second lens group L2 move, as a whole, to the front along the optical axis OX, with changing the relative position therebetween, thereby zooming being performed.

FIG. 8 shows a cross-sectional view of an upper half of the zoom lens 11A when it is located at the telephoto extremity, and FIG. 11 shows a cross-sectional view of an upper half of the zoom lens 11B when it is located at the telephoto extremity. If the zoom motor 18 is rotated reversely, the lens barrel 11 and the lens groups L1 and L2 move in an opposite manner.

The focusing operation in each focal length step is controlled as follows.

When the zoom operation member 61 is operated, the zoom lens 11A (11B) is extended or retracted as described above. Then, the brush 52 contacts a portion of the code plate 51 at a position corresponding to one of the focal length steps of the zoom lens, thereby a current focal length step being detected. It should be noted that, for each focal length step, the zoom lens barrel 11 (11A or 11B) has a movable range. By moving the zoom lens 11 (11A or 11B) within the movable range, the focusing condition can be changed with maintaining the focal length. The code plate is configured such that a code pattern indicative of the focal length of the lens is detected when the zoom lens barrel 11 (11A or 11B) is located at a wide extremity side (i.e., the retracting direction) within the movable range of each focal length step. The focusing is performed by counting the number of pulses when the zoom lens 11 is moved from a reference position, which is defined as a position on a telephoto extremity side with respect to the code pattern in the movable range of each focal length step. After the detection of the current focal length step, the lens 11A (11B) is located at a stand-by position, which is defined as a position on the wide extremity side with respect to the reference position. It should be noted that the camera 10 according to the embodiment has a finder system (not shown in the drawings), which has a finder optical system independent from the photographing optical system. Therefore, when the photographing operation is not executed, it is not necessary to locate the zooming lens 11 at an in-focus position.

When the release button is depressed halfway, based on the output of the distance measuring module 63, the object distance is detected by the CPU 60. Then, the CPU 60 calculates the rotation angle of the cam ring 25 to bring the zoom lens 11A (11B) to an in-focus position in the currently set focal length step, in accordance with the formula stored in the ROM 65. Then, the current rotational position of the cam ring 25 is compared with the calculated rotation angle, and the number of driving pulses to be applied to the zoom motor 18 to bring the cam ring 25 to the calculated position is determined.

If the release button is fully depressed and the ON signal is output from the shutter release member 62, the CPU 60 drives the zoom motor 18 to extend the zoom lens 11A (11B). Since the zoom lens 11A (11B) is located at the stand-by position, when it is extended, the code pattern is firstly detected. Then, upon passage of the reference position, the number of pulse is counted. The pulse is output by the photo interrupter 21. When the number of pulses reaches the calculated number, the CPU 60 stops the zoom motor 18 and holds the zoom lens 11A (11B) at the in-focus position (i.e., the stopped position), and drives the shutter drive motor 34 to open and then close the shutter blades 38 to perform photographing. After the photographing operation has been performed, the zoom lens 11A (11B) is driven back to the stand-by position corresponding to the current focal length step.

In the above-described embodiment, the focusing is performed when the shutter button is fully depressed. However, the invention is not limited to such a configuration, and as in conventional cameras, focusing may be performed when the shutter button is depressed halfway. Further, the stand-by position of the zoom lens may not be limited to the positions as described above.

In order to provide two zoom lenses having different zooming ranges, the following method may be used. That is, if the zoom lens is a conventionally used lens system, which includes a plurality of lenses which are moved along respective loci to change the focal length without changing a focusing condition, by limiting the movable range of the lens, another zoom lens whose zooming range is narrower than the other can be obtained. For example, if zoom lenses whose focal length range if 28 mm through 120 mm, and 28 mm through 90 mm, respectively, simply by limiting the variable range of the latter lens, the former lens can be obtained. The variable range may be limited using a software for controlling the zooming operation. In such a configuration, the structure of the zoom lens remains unchanged.

If the zoom lens is a step zoom lens as in the embodiment, it is possible to reduce the number of steps unless each focal length step is unchanged. For example, if focal length steps of a certain lens are 28 mm, 38 mm, 45 mm, 60 mm and 70 mm, another lens whose focal length steps are 28 mm, 38 mm, 45 mm and 60 mm can be obtained easily by controlling the latter zoom lens not to used the focal length step of 70 mm. Also in this case, using the same lens structure, different zoom lens system can be obtained. Since the lens structure is identical, only one kind of FPC connecting the shutter block and the CPU is necessary.

If the zoom lens is a step zoom lens, an the number of focal length steps is different or a range of each focal length step are different, it is impossible to employ the same structure for such zoom lenses. For example, the zoom lens barrel 11A is configured such that the focal length range is 38 mm through 70 mm, which is divided into four focal length steps, while the zoom lens barrel 11B is configured such that the focal length range is 38 mm through 80 m, which is divided into four focal length steps. Between these two lenses 11A and 11B, the length in the optical axis OX and/or extending amount of the lens barrel may be different. Specifically, the lengths of the stationary barrel 13 (13A, 13B), cam ring 25 (25A, 25B), linear guide ring 28 (28A, 28B), and lens mounting barrel 35 (35A, 35B) are different. Further, the shape of the second lens guide cam grooves 50 (50A, 50B) is also different.

Regarding other components of the zoom lenses 11A and 11B, for example, the first lens group L1, the second lens group L2, lens frames and the shutter block 37, the same members are used for both lenses 11A and 11B. It should be noted, however, as is known from FIGS. 8 and 11, positions, with respect to the focal plane F, of the shutter block 37 in the direction of the optical axis OX when the zoom lenses 11A and 11B are fully extended are different. That is, the distance between the shutter block 37 and the focal plane F is greater in the zoom lens barrel 11B having the longer focal length (80 mm). In other words, in the zoom lens barrel 11B, a length between the CPU 60 or the front end of the housing 12 and the shutter block 37 is longer. Therefore, the FPC 44 is to be configured to have a sufficient length to connect the CPU 60 with the shutter block 37 when the zoom lens barrel 11B is fully extended. The FPC 44 having such a length is used for the zoom lens barrel 11A, however, the FPC 44 is slightly too long. The FPC 44 has a particular feature to solve the above problem.

Arrangement of FPC board

Hereinafter, the FPC board arrangement structure will be described in detail.

Figure 12:
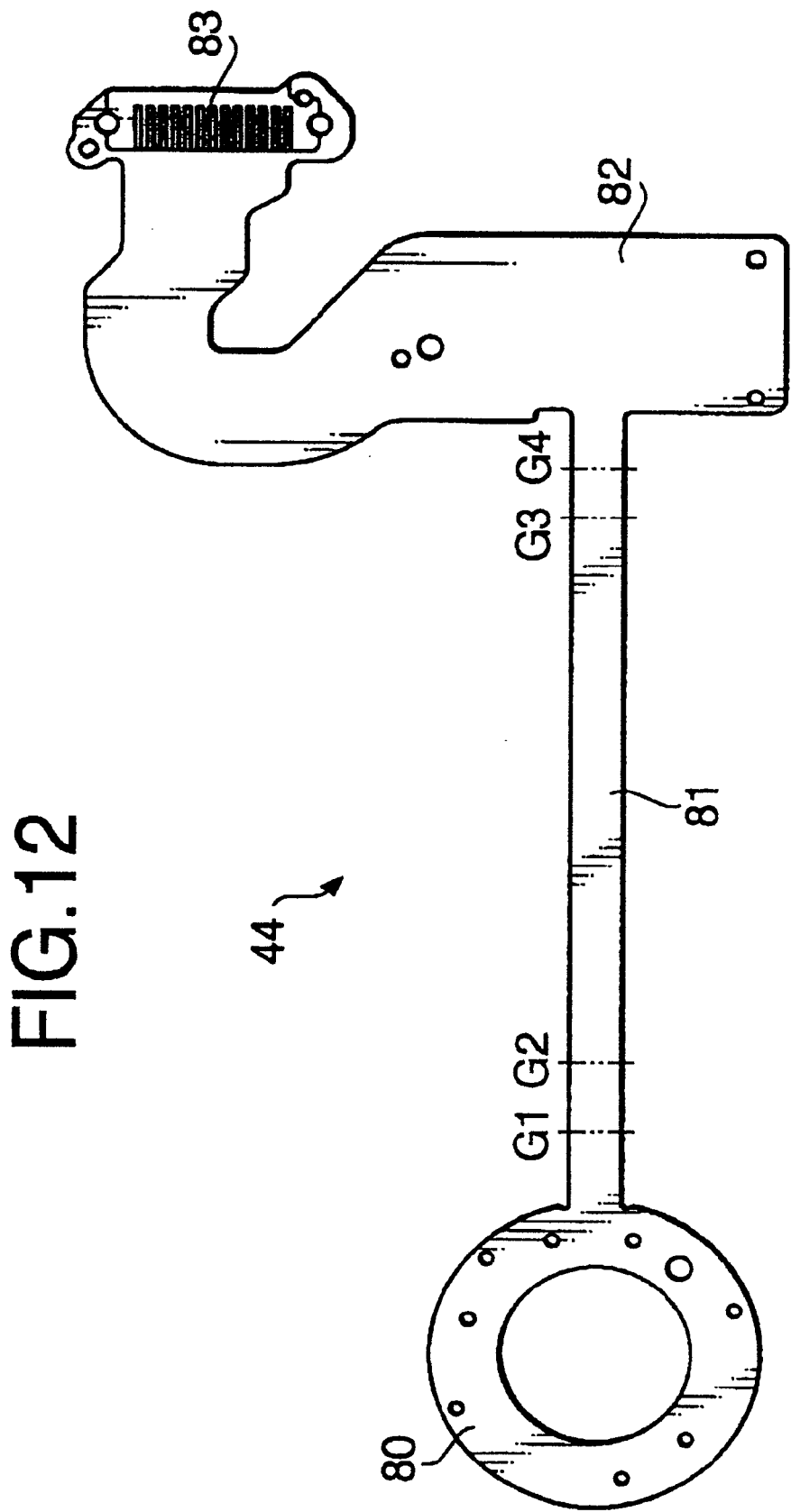
FIG. 12 is a developed view of the FPC board which can be used either of the zoom lenses shown in FIGS. 6–8 or FIGS. 9–11.

FIG. 12 shows a developed view of the FPC board 44 according to the embodiment. As shown in FIG. 12, the FPC board 44 has an annular portion 80, which is secured on the front surface of the shutter block 37. From the annular portion 80, an elongated rectangular portion 81 extending in the optical axis direction is formed. On an end, opposite to the annular portion 80, of the elongated rectangular portion 81, a widened portion 82 is formed, which is to be secured on a FPC mounting surface 90 of the housing 12, and at an end of the widened portion 82, a connector portion 83 which is to be connected to the CPU 60 is formed.

When assembled in the zoom lens 11B, the elongated rectangular portion 81 extends, as shown in FIG. 9, from the front end of the shutter block 37, along the outer surface thereof, toward the film plane F, along the optical axis direction. The rectangular portion 81 passed through a clearance between the inner surfaces of the linear guide ring 28 and linear guide portion 40, and the outer surfaces of the shutter mounting ring 36 and the second group lens frame 47 to form a first linear portion 84. Specifically, the elongated rectangular portion 81 extends along the outer circumference of the shutter block 37, a bottom surface of the first linear guide groove 41 of the shutter mounting ring 36, and the outer circumference of the ring-shaped portion of the second lens group frame 47.

Then the elongated rectangular portion 81 forms a U-shaped portion 85 on the rear side of the linear guide plate 30 provided on the rear end portion of the linear guide ring 28. The elongated rectangular portion 81 straddles the linear guide ring 28 and the rear end portion of the cam ring 25, and extends toward the front. The stationary barrel 13 has an FPC escape opening 91, which is elongated in the optical axis direction. The elongated rectangular portion 81 directed toward the front side from the U-shaped portion 85 passes through the escape opening 91, and extends along the inner circumferential surface of the housing 12 to form a second linear portion 86. The elongate rectangular portion 81 changes its extending direction at the front end of the housing 12 to a radial direction to form a radially extending portion 87. At the end of the radially extending portion 87, the widened portion 82 is connected. In the stationary barrel 13, a guide surface 92, which extends in the radial direction, is defined at a position facing the front end of the housing 12, and the radially extending portion 87 extends along the guide surface 92.

When the zoom lens barrel 11 (11A or 11B) is fully retracted, as shown in FIGS. 6 and 9, the first linear portion 84 is substantially as long as the second linear portion 86. When the zoom lens barrel 11 is slightly extended and located at the wide extremity, as shown in FIGS. 7 and 10, the first linear portion 84 is longer than the second linear portion 86. When the zoom lens 11 is further extended and located at the telephoto extremity, as shown in FIG. 8 or 11, the length of the second linear portion 86 is its minimum length, and the length of the first linear portion 84 is its longest length. The U-shaped portion 85 changes its position along the optical axis OX in accordance with the position of the rear end of the linear guide ring 28.

As described above, in either one of the zoom lens barrels 11A and 11B, the FPC board 44 follows the extending/retracting movement of the zoom lens by changing the ratio of the lengths of the first linear portion 84 to the second linear portion 86. Thus, the FPC board 44 is configured to have a deformable portion including the first linear portion 84, U-shaped portion 85 and second linear portion 86, and the U-shaped portion 85 changes its position within the deformable portion in accordance with the extending amount of the zoom lens barrel 11. It should be noted that the moving amount of the shutter block 37 (i.e., the supporting barrel 35) with respect to the housing 12 is substantially twice the moving amount of the cam ring 25 with respect to the housing 12. Accordingly, the total length of the deformable portion is kept constant regardless of the extending amount of the zoom lens barrel 11. It should be further noted that the length of the deformable portion for the lens barrel 11A and that for the lens barrel 11B are different. In the embodiment, the length of the deformable portion of the zoom lens barrel 11B is longer than that of the zoom lens barrel 11A.

Next, the difference between the arrangements of the FPC board 44 in the zoom lens barrels 11A and 11B will be described.

In the zoom lens barrel 11B, at a portion from the annular portion 80 to the first linear portion 84, the elongated rectangular portion 81 is bent substantially at a right angle at a bending position G1 defined on the elongated rectangular portion 81 in the vicinity of the annular portion 80 (see FIG. 12). Thus, the FPC board 44 is supported by the front surface and the outer circumference of the shutter block 37 substantially without play. At the other end portion, which is connected to the CPU 60, between the second linear portion 86 and the radially extended portion 87, the FPC board 44 is bent in opposite directions at positions G3 and G4, respectively, thereby an intermediate folded portion 93 being formed (see FIGS. 9–11). The intermediate folded portion 93 slightly inclined with respect to the optical axis OX. The intermediate folded portion 93 includes an extended linear portion 98, which is an extension of the second linear portion 86, and a fold back linear portion 99, which is a portion folded back at the position G3. The elongated rectangular portion 81 further bent at a position G4 between the fold back linear portion 99 and the radially extended portion 87, by approximately 90 degrees so as to be directed to the CPU 60 arranged outside the lens barrel 11B. As shown in FIGS. 9–11, a folded portion escape opening 94 is formed on the stationary barrel 13B. Through the folded portion escape opening 94, the intermediate folded portion 93 protrudes outside.

The intermediate folded portion 93 functions as follows.

As shown in FIG. 11, when the zoom lens barrel 11B is located at the telephoto extremity, the cam ring 25B and the housing 12B overlap very little in the direction of the optical axis OX. Thus, the length of the second linear portion 86 is substantially zero. If the FPC board 44 does not have the intermediate folded portion 93, when the zoom lens barrel 11B is moved in the retracting direction, relatively strong load may apply to a portion T of the FPC board 44, where the FPC board 44 contacts the housing 12B. If the intermediate folded portion 93 is provided, as in the embodiment, due to the shape of the FPC board 44 about the portion T, such a problem is avoidable, i.e., the strong force will not be applied to the portion T.

The arrangement of the FPC board 44 in the zoom lens barrel 11A is different from that in the zoom lens barrel 11B.

As shown in FIG. 6, the elongated rectangular portion 81 is formed to be a first folded linear portion 95, which extends in a direction approaching the optical axis OX, in the vicinity of the annular portion 80. Specifically, the elongated rectangular portion 81 is bent by 180 degrees at position G1 (see FIG. 12) toward the optical axis OX. Then, at position G2, the elongated rectangular portion 81 is folded back by approximately 180 degrees to form a second folded linear portion 96. The second folded linear portion 96 extends along the other portion bent at position G1, and extends along the outer circumference of the shutter block 37A in the direction of the optical axis OX and forms the first linear portion 84. Thus, in the zoom lens barrel 11A, between the shutter block 37A and the first linear portion 84, a front folded portion 97 of the FPC board 44, which is folded on the front side of the shutter block 37A, is formed. The front folded portion 97, which includes the first folded linear portion 95 and the second folded linear portion 96, does not change its length regardless of a location of the zoom lens barrel 11A within the fully extended position (FIG. 8) and the retracted position (FIG. 6). It should be noted that the FPC board 44 is not formed with the intermediate folded portion 93 in the zoom lens barrel 11A.

In FIG. 12, the positions G1–G4 where the FPC board 44 is bent are indicated by lines, respectively. However, the FPC board 44 is bent to form a U-shaped portion with respect to each of the positions G1–G4 so that the wires in the FPC board 44 will not be broken.

As described above, the extending amounts of the zoom lens barrels 11A and 11B are different. In order to use the FPC board 44, which is commonly used in the zoom lens barrels 11A and 11B, in the zoom lens barrel 11A without a biasing mechanism or the like to prevent a slack of the FPC board 44, the deformable portion (including the first linear portion 84, the U-shaped foldable portion 85, and the second linear portion 86) when implemented in the zoom lens barrel 11A should be made shorter than that when implemented in the zoom lens barrel 11B.

According to the arrangement of the FPC board 44 in the zoom lens barrel 11A described above, the elongated rectangular portion 81 is formed to be the front folded portion 97 in the vicinity of the annular portion 80, and then, the first linear portion 84 is formed. Since the front folded portion 97 keeps its folded condition regardless of the extending/retracting movement of the zoom lens barrel 11A, the deformable portion of the FPC board 44 for the zoom lens barrel 11A can be made shorter than that for the zoom lens barrel 11B without a biasing mechanism or the like. Accordingly, the FPC board 44 for the zoom lens barrel 11B can also be used for the zoom lens barrel 11A, without producing a slack portion, by employing a relatively simple arrangement.

It should be noted that the length of the front folded portion 97 as unfolded (i.e., the length of the folded linear portions 95 and 96 plus curved portions around the folded linear portions) is longer than the length of the intermediate folded portion 93 as unfolded (i.e., the length of the extended linear portion 98, folded back linear portion 99 plus curved portions thereabout). Therefore, although the maximum extending amounts of the zoom lens barrels 11A and 11B are different, because of the difference of the lengths of the folded portions 97 and 93, the same FPC board 44 can be used in both the zoom lens barrels 11A and 11B.

According to the above-described arrangement, the intermediate folded portion 93 is formed only for the zoom lens barrel 11B. Therefore, the front folded portion 97 for the zoom lens barrel 11A is formed, the length corresponding to the intermediate folded portion 93 is included therein.

According to the embodiment, therefore, in order to use the same FPC board 44 for zoom lens barrels 11A and 11B having different specifications, folded portions are formed/developed appropriately. Thus, the arrangement of the FPC board 44 is optimized in either one of the zoom lens barrels 11A and 11B.

It should be noted that the present invention is not limited to the configuration described above with reference to the embodiment. For example, the specifications of the zoom lens barrels and/or the positions of the folded portions may be different from that of the embodiment. According to the embodiment, when the FPC board 44 is implemented in the zoom lens barrel 11A which has a smaller extending amount, the front folded portion 97 is formed at a position closer to the shutter block 37, and when implemented in the zoom lens barrel 11B which has a longer extending amount, the intermediate folded portion 93 is formed at a position closer to the CPU 60. It may be modified such that, in the zoom lens barrel 11A, the folded portion may be formed at a position closer to the CPU 60 as in the zoom lens barrel 11B, instead of the front folded portion 97. Further, depending on the structure of the lens, the folded portion may be formed at a different position. In a particular case, the length of the FPC board may be adjusted such that no folded portion is formed when implemented in a lens barrel having the greatest extending amount.

In the embodiment, as an example of the zoom lens barrels having different specifications, the two zoom lenses have the same number of focal length steps and different zooming range. The invention can be applied to other types of lenses having different extending amounts. For example, even in conventional types of zoom lenses or step zoom lenses having different number of focal length steps, if the extending amounts of the zoom lenses are different, it is preferable to use a dedicated FPC board in view of downsizing. In such a case, by employing the arrangement according to the invention, the same FPC board can be used for the lenses having different extending amounts.

It should be noted that there are zoom lenses having the same zooming range but different extending amounts. The present invention can also be applied to such lenses.

The present disclosure relates to the subject matter contained in Japanese Patent Application No. 1000-264109, filed on Aug. 31, 2000, which is expressly incorporated herein by reference in its entirety. step zoom lenses having different number of foal length steps, if the extending amounts of the zoom lenses are different, it is preferable to use a dedicated FPC board in view of downsizing. In such a case, by employing the arrangement according to the invention, the same FPC board can be used for the lenses having different extending amounts.

It should be noted that there are zoom lenses having the same zooming range but different extending amounts. The present invention can also be applied to such lenses.

The present disclosure relates to the subject matter contained in Japanese Patent Application No. 2000-264109, filed on Aug. 31, 2000, which is expressly incorporated herein by reference in tis entirety.

What is claimed is:

1. A flexible printed circuit board arrangement structure for zoom lens barrels of a camera, said zoom lens barrels having different extendible/retractable ranges, said flexible printed circuit board connecting a shutter block carried by each zoom lens and a controller carried by the camera, wherein said flexible printed circuit board has a first portion to be connected to the shutter block, a second portion to be connected to the controller, and a connecting portion connecting said first portion and said second portion, said connecting portion including at least one foldable portion and a deformable portion, said deformable portion being deformed to change its shape in accordance with a movement of said zoom lens barrel, said at least one foldable portion is folded at least when said flexible printed circuit board is implemented in one of said zoom lens barrels, said at least one foldable portion being unfolded when said flexible printed circuit board is implemented in another zoom lens barrel.

2. The structure according to claim 1, wherein when said at least one foldable portion is folded, a first portion side area of said connecting portion is folded, said at least one foldable portion being located, when folded, in front of said shutter block, said at least one foldable portion as folded including at least one linearly extending area which extends in a direction substantially perpendicular to the optical axis.

3. The structure according to claim 2, said at last one linearly extending area including a plurality of linearly extending areas overlaid along the optical axis direction.

4. The structure according to claim 2, wherein said at least one foldable portion having a second foldable portion which is located at a second portion side area of said connecting portion, said second foldable portion being folded when said flexible printed circuit board is implemented to said another zoom lens barrel, said second foldable portion as folded being smoothly connected to said deformable portion to form a linearly extending portion which is substantially an extension of said deformable portion and a folded back portion overlaid on said linearly extending portion, an end of said folded back portion being bent toward the controller.

5. The structure according to claim 1, wherein said at least one foldable portion is located at a second portion side area of said connecting portion, said at least one foldable portion as folded being smoothly connected to said deformable portion to form a linearly extending portion which is substantially an extension of said deformable portion and a folded back portion overlaid on said linearly extending portion, an end of said folded back portion being bent toward the controller.

6. The structure according to claim 1, wherein each of said zoom lens barrels has a stationary barrel, a first extendible portion and a second extendible portion which moves in accordance with a movement of said first extendible portion, said second extendible portion being inside said first extendible portion along a direction perpendicular to the optical axis, said first extendible portion being inside said stationary barrel along a direction perpendicular to the optical axis, a moving amount of said second extendible portion being approximately twice a moving amount of said first extendible portion, the shutter block being mounted on said second extendible portion.

7. The structure according to claim 6, wherein said deformable portion includes:

a first area, which extends along an optical axis direction, between said shutter block and said second extendible portion, a U-shaped portion bent to form a U-shaped curved portion; and a second area, which extends in an optical axis direction, between said stationary barrel and said first extendible portion;

a length of said deformable portion being substantially constant regardless of an extended amount of said zoom lens barrel, the location of said U-shaped portion being changed so that a relative proportion of lengths of said first area and said second area is changed in accordance with an extended amount of the zoom lens barrel.

8. A flexible printed circuit board arrangement structure for zoom lens barrels of a camera, said zoom lens barrels having different extendible/retractable ranges, said flexible printed circuit board connecting a shutter block carried by each zoom lens and a controller carried by the camera, wherein said flexible printed circuit board has a first portion to be connected to the shutter block, a second portion to be connected to the controller, and a connecting portion connecting said first portion and said second portion, said connecting portion including a plurality of foldable portions and a deformable portion, said deformable portion being deformed to change its shape in accordance with the extended position of a zoom lens barrel in which said flexible printed circuit board is implemented, said plurality of foldable portions being selectively folded in accordance with the extendible/retractable amount of said zoom lens barrel in which said flexible printed circuit board is implemented.

9. The structure according to claim 8, wherein said connecting portion i an elongated rectangular portion when said flexible printed circuit board is unfolded.

10. The structure according to claim 8, wherein each of said zoom lens barrels has a stationary barrel, a first extendible portion and a second extendible portion which moves in accordance with a movement of said first extendible portion, said second extendible portion being inside said first extendible portion along a direction perpendicular to the optical axis, said first extendible portion being inside said stationary barrel along a direction perpendicular to the optical axis, a moving amount of said second extendible portion being approximately twice a moving amount of said first extendible portion, the shutter block being mounted on said second extendible portion.

11. The structure according to claim 10, wherein said deformable portion includes:

a first area, which extends in a optical axis direction, between said shutter block and said second extendible portion, U-shaped portion bent to form a U-shaped curved portion; and a second area, which extends in an optical axis direction, between said stationary barrel and said first extendible portion;

a length of said deformable portion being substantially constant regardless of an extended amount of said zoom lens barrel, the location of said U-shaped portion being changed so that a relative proportion of lengths of said first area and said second area is changed in accordance with an extended amount of the zoom lens barrel.

12. A flexible printed circuit board arrangement structure for zoom lens barrels of a camera, said zoom lens barrels having different extendible/retractable ranges, said flexible printed circuit board connecting a shutter block carried by each zoom lens and a controller carried by the camera, wherein said flexible printed circuit board has a first portion to be connected to the shutter block, a second portion to be connected to the controller, and a connecting portion connecting said first portion and said second portion, said connecting portion having a deformable portion, said deformable portion being deformed to change its shape in accordance with the extended position of a zoom lens barrel in which said flexible printed circuit board is implemented, said connecting portion having at least one folded portion being folded at least when said flexible printed circuit board is implemented in a zoom lens having a shorter extendible/retractable range, said at least one folded portion being unfolded when said flexible printed circuit board is implemented in a zoom lens having a longer extendible/retractable range.

13. The structure according to claim 12, wherein said at least one folded portion is formed by folding a first portion side area of said connecting portion, said at least one folded portion being located in front of said shutter block, said at least one folded portion including at least one linearly extending area which extends in a direction substantially perpendicular to the optical axis.

14. The structure according to claim 13, said at least one linearly extending area including a plurality of linearly extending areas overlaid along the optical axis direction.

15. The structure according to claim 12, wherein said at least one folded portion is formed by folding a second portion side area of said connecting portion, said at least one folded portion being smoothly connected to said deformable portion to form a linearly extending portion which is substantially an extension of said deformable portion and a folded back portion overlaid on said linearly extending portion, an end of said folded back portion being bent toward the controller.

16. The structure according to claim 12, wherein each of said zoom lens barrels has a stationary barrel, a first extendible portion and a second extendible portion which moves in accordance with a movement of said first extendible portion, said second extendible portion being inside said first extendible portion along a direction perpendicular to the optical axis, said first extendible portion being inside said stationary barrel along a direction perpendicular to the optical axis, a moving amount of said second extendible portion being approximately twice a moving amount of said first extendible portion, the shutter block being mounted on said second extendible portion.

17. The structure according to claim 16, wherein said deformable portion includes:

a first area, which extends in a optical axis direction, between said shutter block and said second extendible portion, a U-shaped portion bent to form a U-shaped curved portion; and a second area, which extends in an optical axis direction, between said stationary barrel and said first extendible portion;

a length of said deformable portion being substantially constant regardless of an extended amount of said zoom lens barrel, the location of said U-shaped portion being changed so that a relative proportion of lengths of said first area and said second area is changed in accordance with an extended amount of the zoom lens barrel.

* * * * *